(12) United States Patent
Cheng et al.

(10) Patent No.: US 11,972,935 B2
(45) Date of Patent: Apr. 30, 2024

(54) METHODS FOR PROCESSING A SEMICONDUCTOR SUBSTRATE

(71) Applicant: Taiwan Semiconductor Manufacturing Co., Ltd., Hsinchu (TW)

(72) Inventors: Yu-Hsiang Cheng, Hsinchu (TW); Bo-Lin Wu, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 319 days.

(21) Appl. No.: 17/459,832

(22) Filed: Aug. 27, 2021

(65) Prior Publication Data

US 2023/0065243 A1 Mar. 2, 2023

(51) Int. Cl.
*H01J 37/32* (2006.01)
*C23C 16/458* (2006.01)
*H01L 21/66* (2006.01)
*H01L 21/677* (2006.01)

(52) U.S. Cl.
CPC ...... *H01J 37/3288* (2013.01); *C23C 16/4584* (2013.01); *H01J 37/32743* (2013.01); *H01J 37/32807* (2013.01); *H01L 21/67706* (2013.01); *H01L 22/10* (2013.01); *H01J 2237/3321* (2013.01)

(58) Field of Classification Search
CPC ............ H01J 37/3288; H01J 37/32743; H01J 37/32807; H01J 2237/3321; C23C 16/4584; C23C 16/4401; C23C 16/4585; C23C 16/4586; H01L 21/67706; H01L 22/10; H01L 21/68742; H01L 21/68764; H01L 21/68771; H01L 21/68792; H01L 21/67155; H01L 21/67196; H01L 21/67253; H01L 21/67703
See application file for complete search history.

(56) References Cited

U.S. PATENT DOCUMENTS

| | | | |
|---|---|---|---|
| 9,698,042 B1 * | 7/2017 | Baldasseroni | .... H01L 21/67748 |
| 10,655,224 B2 * | 5/2020 | Agarwal | ............. C23C 16/4581 |
| 10,699,937 B2 * | 6/2020 | Konkola | .......... H01L 21/68742 |
| 2022/0367159 A1 * | 11/2022 | Britcher | ............. C23C 16/4586 |

* cited by examiner

*Primary Examiner* — J. E. Schoenholtz
(74) *Attorney, Agent, or Firm* — Seed IP Law Group LLP (57) ABSTRACT

The present disclosure relates to methods of processing a semiconductor substrate in a processing chamber, such as a chemical vapor deposition chamber. The chemical vapor deposition chamber includes a spindle mechanism that cooperates with one or more carrier ring forks to move the semiconductor substrate from one station to another station. The methods include monitoring one or more spindle operation parameters and carrying out one or more maintenance steps on the spindle mechanism based on the results of monitoring the one or more spindle operation parameters. The monitored spindle operation parameters provide an indication of undesirable vibration of the semiconductor substrates in the processing chamber. The vibration of the semiconductor substrates in the processing chamber is undesirable because it promotes generation of unwanted particles that deposit onto a surface of the semiconductor substrate.

20 Claims, 9 Drawing Sheets

METHODS FOR PROCESSING A SEMICONDUCTOR SUBSTRATE

BACKGROUND

In atomic layer deposition (ALD), a film is deposited layer by layer by successive dosing and activation steps. ALD is used to generate conformal films on high aspect ratio structures. In some ALD processes film deposition on the backside of the wafer is difficult to avoid because the film can be deposited through any gap accessing the wafer backside. Backside deposition is unwanted for a number of reasons, one of which is that excess film on the backside of the wafer is susceptible to flaking, e.g., during wafer transport. If flakes from the backside of the wafer come into contact with a wafer (either the same wafer or a different wafer), the wafer is contaminated and defects can result.

In capacitive coupled plasma chambers, a small gap is desired between the pedestal and the wafer. This gap induces impedance between the wafer and the pedestal that is sufficient to essentially drown out the impedance variations caused by variations of the pedestal surfaces on the micro scale. To create the small gap between the pedestal and the wafer, minimum contact area (MCA) features are used to create a level virtual offset place with supports that ensure a flat wafer plane. As noted above, the gap between the pedestal and the wafer provides access to the backside of the wafer and thereby facilitates film deposition on the backside of the wafer.

Pedestals used in conventional ALD and plasma-enhance chemical vapor deposition (PECVD) systems typically include multiple MCA features that are adjustable in height. The current pedestal design guidelines specify the use of enough MCA features to ensure that the support plane created by these features holds a wafer parallel to the pedestal. Indeed, a design is considered inadequate if the number of MCA features used allows for wafer deflection or sag. Thus, in some pedestal designs, more than 30 MCA features are used to support the wafer. In some instances during processing, the films deposit onto components of the chamber in which the deposition is carried out.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A "substrate" as referred to herein, includes, but is not limited to, semiconductor wafers, semiconductor workpieces, and other workpieces such as optical planks, memory disks and the like. Embodiments of the invention may be applied to any generally flat workpiece on which material is deposited by the methods described herein and utilizing the devices described herein.

"Vertical direction" and "horizontal direction" are to be understood as indicating relative directions. Thus, the horizontal direction is to be understood as substantially perpendicular to the vertical direction and vice versa. Nevertheless, it is within the scope of the present disclosure that the described embodiments and aspects may be rotated in its entirety such that the dimension referred to as the vertical direction is oriented horizontally and, at the same time, the dimension referred to as the horizontal direction is oriented vertically.

One embodiment described herein is a method for processing a semiconductor substrate in a processing tool that includes steps for preventing or reducing the amount of unwanted particles that are deposited or collect on a surface of the semiconductor substrate. In some embodiments, such particles that are deposited or collect on a surface of the semiconductor substrate are materials deposited on surfaces of the processing chamber in which the semiconductor substrate is being processed which flake off such surfaces. For example, the deposited materials may flake off of surfaces that are adjacent to or in close proximity to the semiconductor substrate when it is in the processing tool. Examples of surfaces from which the deposited material may flake off of, include surfaces of processing chamber components that are used to transfer the semiconductor substrate from one station within the processing tool to another station in the processing tool. For example, such surfaces include the surfaces of a carrier ring used to support the semiconductor substrate during such movement, forks or other components used to lift such carrier rings, an indexing plate which supports the carrier rings or surfaces of a spindle mechanism upon which the indexing plate is supported and which raises, lowers or rotates the carrier ring forks. It has been observed that vibration induced in such components mechanically coupled to the spindle mechanism will cause materials deposited on such components to flake off. In accordance with an embodiment of the present disclosure, a semiconductor substrate is positioned on a carrier ring in a processing chamber. The method includes causing a spindle mechanism associated with the processing chamber to move, e.g., through the extension or retraction of a fluid actuated cylinder or the rotation of an electric motor. Movement of the spindle mechanism causes the semiconductor substrate to be moved. During the movement of the spindle mechanism, operation parameters of the spindle mechanism are monitored. In accordance with this embodiment of the present disclosure, the need for maintenance of the spindle mechanism is determined based on results of the monitoring the operation parameters of the spindle mechanism and appropriate maintenance steps are taken based on the results of the monitoring operation parameters of the spindle mechanism. In some embodiments, the spindle operation parameters are selected from pressure of fluid to be delivered to the fluid actuated cylinder of the spindle mechanism, pressure of fluid within the fluid actuated cylinder, electric current received by the electric driven motor, period of time for the carrier ring to be raised, lowered or raised and lowered and vibration of the spindle mechanism. Examples of maintenance steps that are taken in accordance with embodiments of the present disclosure include lubricating the fluid actuated cylinder, lubricating the electric motor or components of the spindle mechanism connected to the electric motor, adjusting the pressure of the fluid to be delivered to the fluid actuated cylinder and replacing seals of the fluid actuated cylinder.

Generally, excited species of processing gases may be generated to assist an atomic layer deposition (ALD) process as described herein. These species may be excited by plasma assistance, UV assistance (photo assistance), ion assistance (e.g., ions generated by an ion source), or combinations thereof. The species are excited in or in the vicinity of the process region within the processing chamber housing to avoid relaxation of the excited states before the ions reach the process region of the batch processing chamber. An embodiment of the present disclosure is described in the context of a CVD process carried out with a plasma enhancement; however, the present disclosure is not limited to an embodiment that carries out a CVD process with plasma enhancement. Embodiments of the present disclosure include other material deposition processes or heat treatment process that are carried out utilizing CVD without plasma enhancement.

Figure 1:
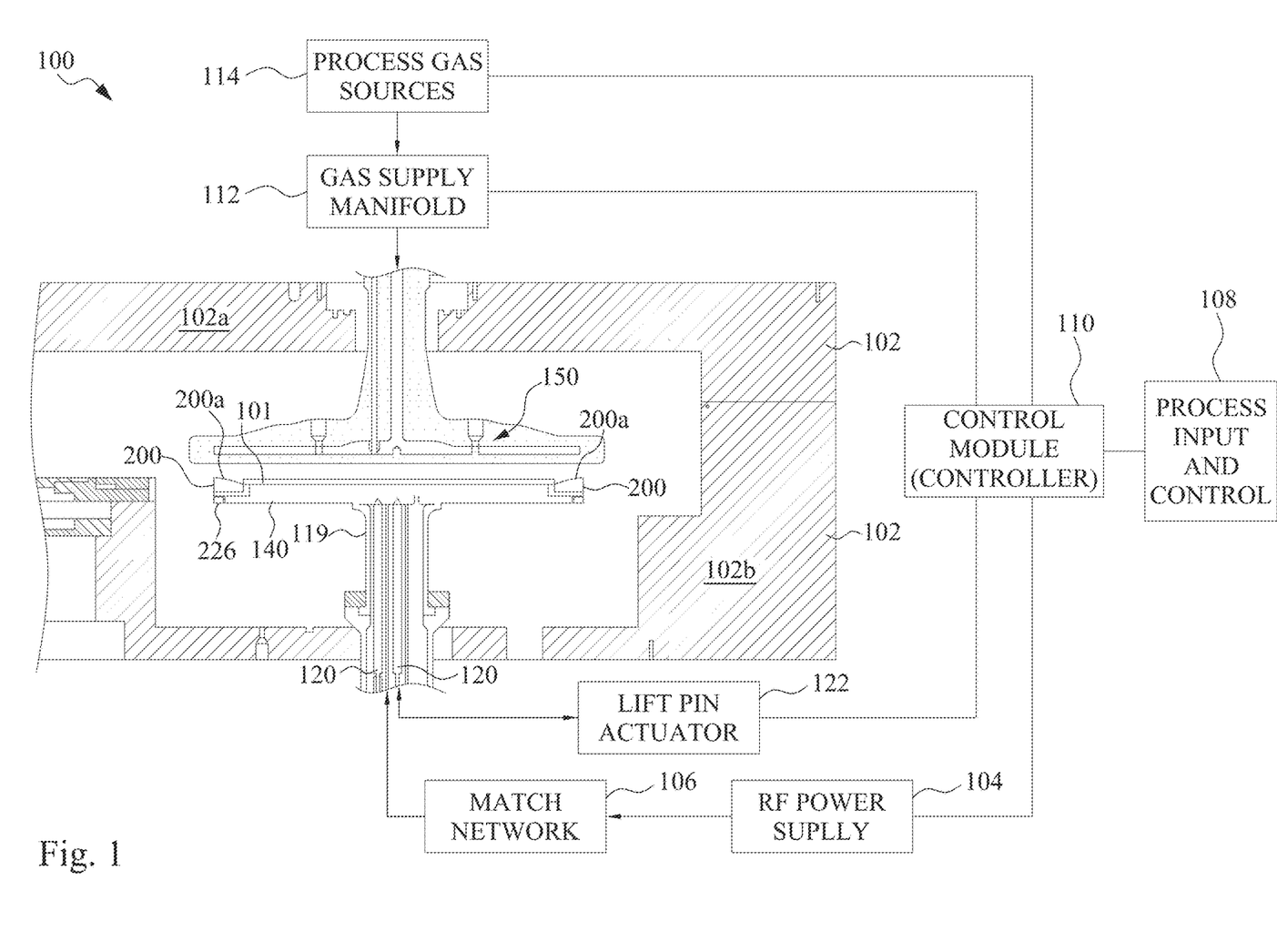
FIG. 1 is a cross-sectional view of a processing chamber for carrying out a process on a substrate in accordance with embodiments of the present disclosure.

FIG. 1 illustrates a substrate processing system 100, which is used to process a substrate, e.g., semiconductor wafer 101. The system includes a chamber 102 having a lower chamber body 102b and an upper chamber body 102a. A center column 119 is configured to support a pedestal 140, which in one embodiment is a powered electrode. The pedestal 140 is defined by a pedestal assembly that includes the center column 119 and a pedestal body that includes a substrate support surface. The pedestal 140 is electrically coupled to power supply 104 via a match network 106. The power supply is controlled by a control module 110, e.g., a controller. The control module 110 is configured to operate the substrate processing system 100 by executing process input and control 108. The process input and control 108 may include process recipes, such as power levels, timing parameters, process gases, mechanical movement of the wafer 101, etc., such as to deposit or form films over the wafer 101 via ALD methods or PECVD methods.

The center column is also shown to include lift pins 120, which are controlled by lift pin control or actuator 122. The lift pins 120 are used to raise the wafer 101 from the pedestal 140 to allow an end-effector (not shown) to pick the wafer and to lower the wafer 101 after being placed by the end end-effector. The substrate processing system 100 further includes a gas supply manifold 112 that is connected to process gases 114, e.g., gas chemistry supplies from a facility. Depending on the processing being performed, the control module 110 controls the delivery of process gases 114 via the gas supply manifold 112. The chosen gases are then flowed into the shower head 150 and distributed in the volume of space defined between the showerhead 150 and the wafer 101 resting over the pedestal 140.

Further, the gases may be premixed or not. Appropriate valves and mass flow control mechanisms may be employed to ensure that the correct gases are delivered during the deposition and plasma treatment phases of the process. Process gases exit chamber via an outlet. A vacuum pump (e.g., a one or two stage mechanical dry pump and/or a turbo-molecular pump) draws process gases out and maintains a suitably low pressure within the reactor by a close loop controlled flow restriction device, such as a throttle valve or a pendulum valve.

Also shown is a carrier ring 200 that encircles an outer region of the pedestal 140. The carrier ring 200 is configured to sit over a ring support region that is a step down from a wafer support region in the center of the pedestal 140. The carrier ring 200 includes an outer edge side of its disk structure, e.g., outer radius, and a wafer edge side of its disk structure, e.g., inner radius, that is closest to where the wafer 101 sits. The upper surface 200a of the carrier ring 200 is sloped to provide a conical knife-edge that permits wafer edge contact and functions as a wafer sliding ramp to 1) enable variable temperature wafer centering and 2) seal off gaseous chemical access to the wafer backside and thereby reduce wafer backside deposition. In accordance with some embodiments of the present disclosure, the carrier ring 200 is lifted along with the wafer 101 and can be rotated to another station, e.g., in a multi-station system. As mentioned above, in some embodiments, the carrier ring 200 is not used for lifting the wafer 101 via carrier ring forks 226. In those embodiments, the wafers 101 are lifted with end effectors (not shown) without moving the carrier ring 200.

Figure 2:
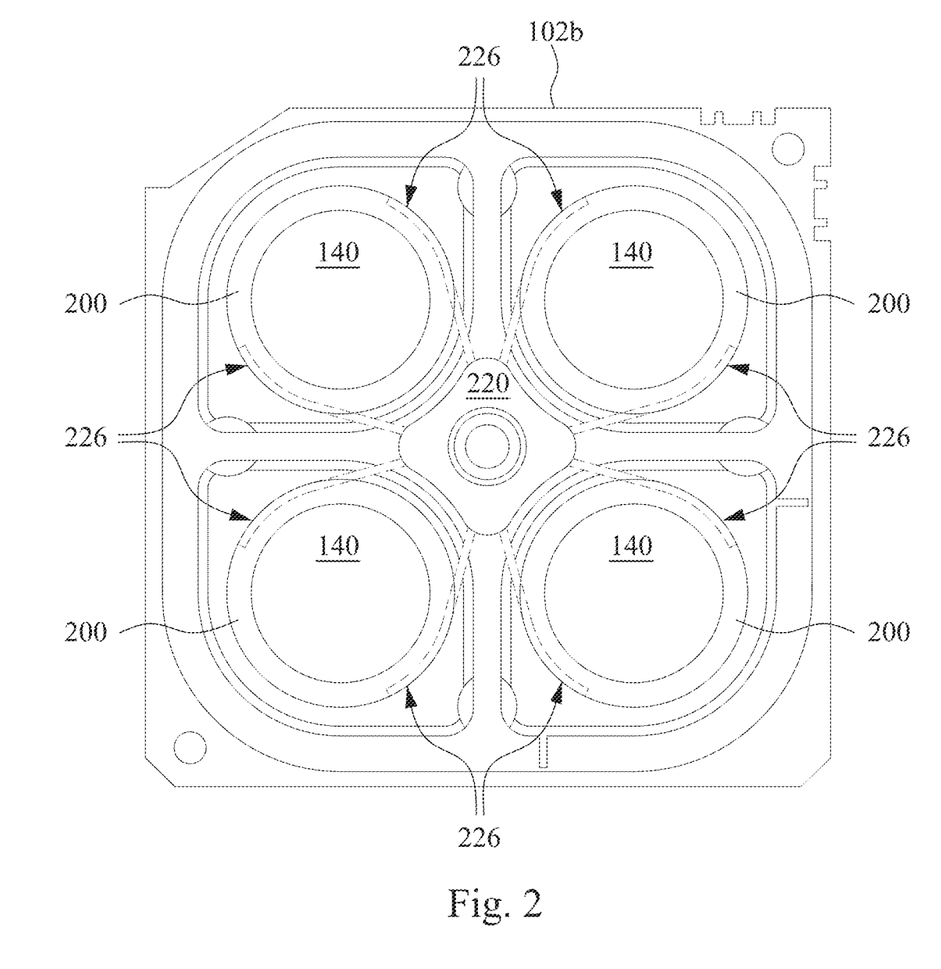
FIG. 2 is a top view of a multi-station substrate processing tool, where four processing stations are provided, each station for carrying out a process on a substrate in accordance with embodiments of the present disclosure.

FIG. 2 illustrates a top view of a multi-station processing tool, wherein four processing stations are provided. This top view is of the lower chamber body 102b (e.g., with the top chamber body 102a removed for illustration), wherein four stations 1-4 are accessed by four carrier ring forks 226. Each carrier ring fork or forks 226 includes a first and second arm, each of which is positioned around a portion of each side of the respective pedestals 140. In this view, the carrier ring forks 226 are drawn in dash-lines, to convey that they are below the carrier ring 200. Each set of the carrier ring forks 226 are coupled to a spindle plate 220 that is configured to raise up and lift the carrier ring forks 226. As described below in more detail with reference to FIG. 4, spindle plate 220 is attached to a spindle (400 in FIG. 4) which is configured to raise, lower and rotation spindle plate 220. As the spindle plate 220 is raised, the carrier ring forks 226 rise and lift carrier rings 200 (i.e., by contacting a lower surface of the carrier rings 200) from the stations simultaneously. In some embodiments, the spindle plate 220 then rotates to another station, before lowering the carrier rings 200 (where at least one of the carrier rings supports a wafer 101) at a next station so that further plasma processing, treatment and/or film deposition can take place on respective wafers 101. In the illustrated embodiment, the sets of carrier ring forks 226 are positioned at equally spaced locations around the spindle plate 220, i.e., each set of carrier ring forks 226 are spaced apart 90 degrees from adjacent sets of carrier ring forks 226. In other embodiments, the spindle plate 220, the various stations 1-4 rotate before the carrier rings 200 are lowered at a next station so that further plasma processing, treatment and/or film deposition can take place on respective wafers 101.

Figure 3:
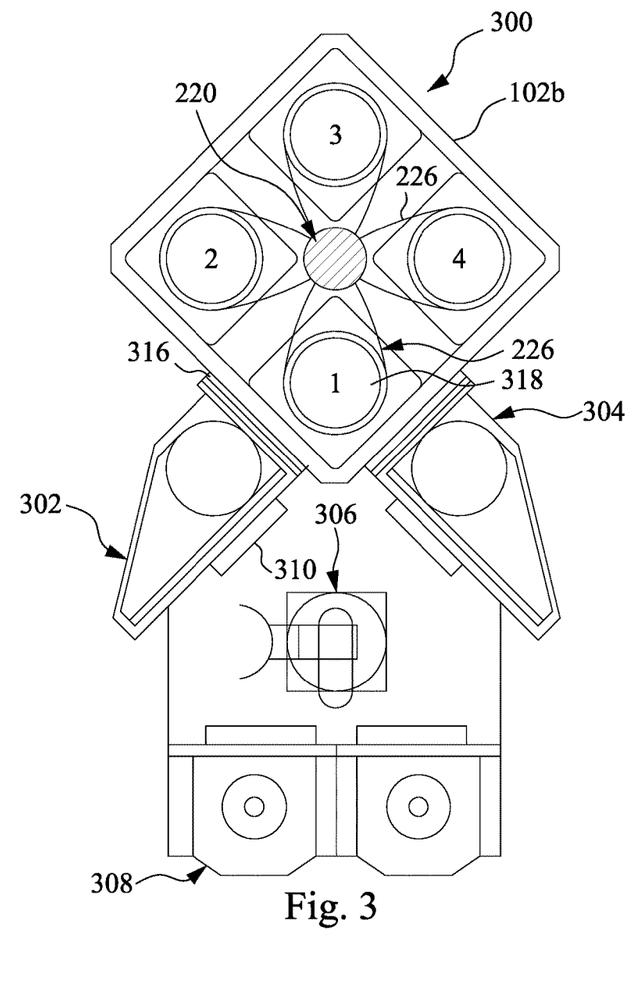
FIG. 3 is a schematic view of a top of a multi-station substrate processing tool with an inbound load lock and an outbound load lock for carrying out a process on a substrate in accordance with embodiments of the present disclosure.

FIG. 3 shows a schematic view of an embodiment of a multi-station processing tool 300 with an inbound load lock 302 and an outbound load lock 304. A robot 306, at atmospheric pressure, is configured to move substrates from a cassette loaded through a pod 308 into inbound load lock 302 via an atmospheric port 310. Inbound load lock 302 is coupled to a vacuum source (not shown) so that, when atmospheric port 310 is closed, inbound load lock 302 may be pumped down. Inbound load lock 302 also includes a chamber transport port 316 interfaced with processing chamber 102b. Thus, when chamber transport port 316 is opened, another robot (not shown) may move the substrate from inbound load lock 302 to a pedestal 140 (see FIG. 2) of a first process station for processing.

The depicted processing chamber 102b comprises four process stations, numbered from 1 to 4 in the embodiment shown in FIG. 3. In some embodiments, processing chamber 102b may be configured to maintain a low pressure environment so that substrates may be transferred using a carrier ring 200 among the process stations without experiencing a vacuum break and/or air exposure. Each process station depicted in FIG. 3 includes a process station substrate holder (shown at 318 for station 1) and process gas delivery line inlets. In some embodiments, a "ring-less" substrate transfer may also be employed. In such embodiments, the carrier ring remains fixed on one station. The substrate is moved by lifting the substrate off of the pedestal with pins, inserting a paddle under the wafer, and then lowering the substrate on pins thus ensuring direct contact with the paddle to substrate. At this point, the substrate is indexed using the paddle to another station. Once the substrate is at the new station, the substrate is lifted off of the paddle with pins, the paddle is rotated or moved out and the pins are lowered to ensure direct contact of the substrate to the pedestal. Now, the substrate processing can proceed at the new station for the indexed (i.e., moved) substrate. When the system has multiple stations, each of the substrates (i.e., those present at stations) can be transferred together, e.g., simultaneously, in the similar fashion for ring-less substrate transfers.

Pedestal 140 and carrier ring 200 can be made from a variety of suitable materials. For example, the pedestal and the focus carrier ring can be made of metal (e.g., aluminum (Al), stainless steel, etc.), dielectric (e.g., alumina (Al.sub.2O.sub.3), yttria (Y.sub.2O.sub.3), etc.), or a coated material (e.g., aluminum coated with yttria or alumina). Wafer 101 is made of a suitable semiconductor material, e.g., silicon (Si). Semiconductor deposition processes can be conducted over a broad range of temperatures depending upon the type of film to be deposited on the substrate (e.g., wafer) and the chemistry used for depositing the film. For example, the deposition temperature for depositing an oxide may be less than about 100 degrees C. and, in some embodiments, less than about 50 degrees C. The deposition temperature for depositing a nitride or carbide is typically less than about 400 degrees C. but, in some embodiments, can be greater than 400 degrees C. Thus, broadly speaking, the deposition temperature may be within the range from 20 degrees C. to 700 degrees C. In one embodiment, the deposition temperature is within the range from 100 degrees C. to 550 degrees C. In another embodiment, the deposition temperature is within the range from 300 degrees C. to 450 degrees C., e.g., about 400 degrees C. As used herein with regard to temperature, the term "about" means.+−0.10 degrees C. Thus, by way of example, a temperature of "about 400 degrees C." indicates a temperature of 390 degrees C. to 410 degrees C.

During transport and processing, it is undesirable for the wafer 101 to move, e.g., by sliding on focus carrier ring 200. With this in mind, the surface roughness of the upper surface 200a of the carrier focus ring 200 should be chosen so that the kinetic friction provided by the upper surface substantially offsets the downward force of gravity. Further, the degree of roughness of the upper surface 200a should not only allow the contact seal provided at the edge the wafer 101 to effectively restrict gaseous chemical access to the backside of the wafer (to restrict deposition on the wafer backside), but also avoid the generation of particles when contacted by the wafer. To obtain a workable balance of the foregoing factors, the upper surface 200a of the carrier focus ring 200 should be relatively smooth. In some embodiments, the upper surface 200a of the carrier focus ring 200 has a surface roughness in the range of 1-32 Ra. In one embodiment, the upper surface of the carrier focus ring has a surface roughness in the range of 2-15 Ra, e.g., 4 Ra.

Figure 4:
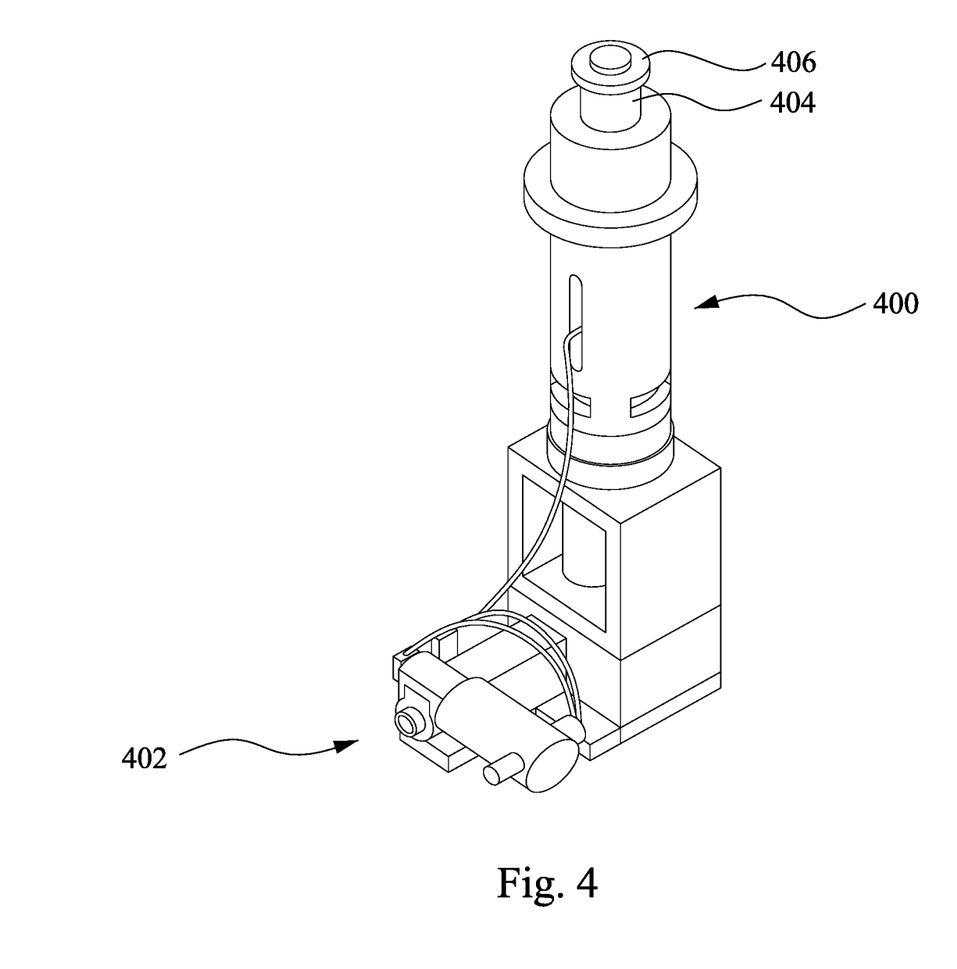
FIG. 4 is an illustration of spindle for use in a multi-station substrate processing tool in which a process in accordance with embodiments of the present disclosure can be carried out.

FIG. 4 illustrates an example of a spindle mechanism 400 useful in accordance with an embodiment of a process in accordance with the present disclosure. Spindle mechanism 400 includes an electrically driven motor 402 and a fluid driven cylinder 404. Electrically driven motor 402 is mechanically coupled to the rotatable spindle 220 in FIG. 2 such that an electrically driven motor 402 is able to rotate spindle plate 220 to which carrier ring forks 226 are mechanically coupled. As explained above, rotation of rotatable spindle 220 along with carrier ring forks 226 transports carrier rings 220 to adjacent stations. While the embodiment of FIG. 4 is described with reference to an electrically driven motor 402, motors which are not electrically driven can be employed in other embodiments. For example, a hydraulically driven motor can be utilized instead of an electrically driven motor. The top end of fluid driven cylinder 404 includes a spindle cap 406. In some embodiments, spindle cap 406 is attached to spindle plate 220. Actuation of fluid driven cylinder 404 causes spindle cap 406 to be extended or retracted. Extending spindle cap 406 causes spindle plate 220 and its associated carrier ring forks 226 to be raised. Retracting spindle cap 406 causes spindle plate 220 and its associated carrier ring forks 226 to be lowered. In other embodiments, raising and lowering spindle cap 406 is accomplished using a driving mechanism other than a fluid driven cylinder. For example, in other embodiments, the spindle cap 406 is raised or lowered using an electrically driven mechanism. In other embodiments, the carrier ring forks are mechanically coupled directly to the spindle cap 406 or the fluid driven cylinder 404.

Figure 5:
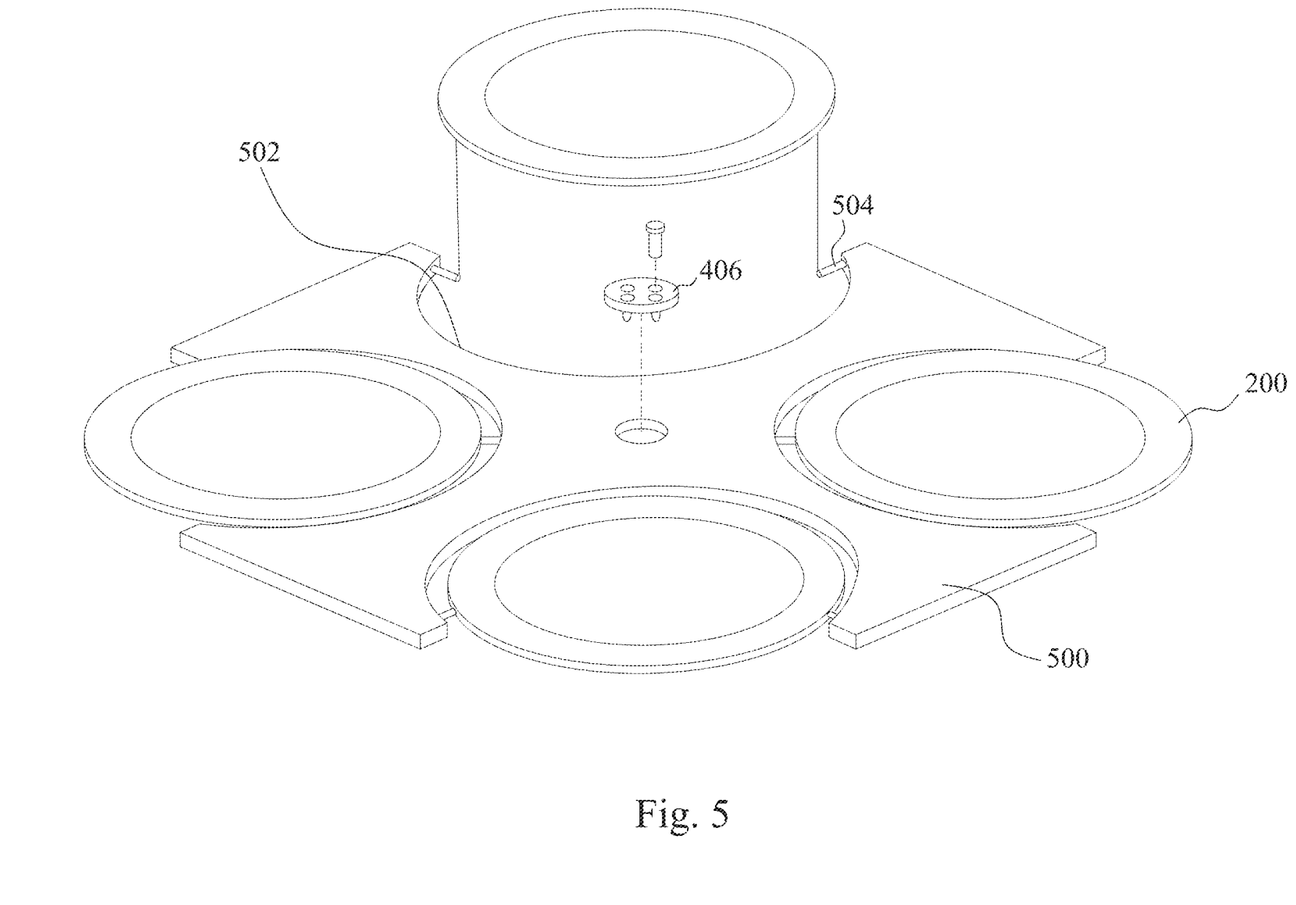
FIG. 5 is a schematic illustration of an indexer plate for use in a system for carrying out a process in accordance with embodiments of the present disclosure.

FIG. 5 shows another embodiment which includes an indexer plate 500 which can be attached to fluid driven cylinder 404 using spindle cap 406. In the embodiment illustrated in FIG. 5, indexer plate 500 includes four receptacles 502. Each receptacle 502 includes a plurality of inwardly extending tabs 504 that provide support for a carrier ring 200 that is received into a receptacle 502. In the illustrated embodiment, three tabs 504 for each receptacle 502 are illustrated; however, embodiments in accordance with the present disclosure are not limited to three tabs 504 per receptacle 502. For example, in other embodiments more than three tabs 504 per receptacle 502 are employed. In the embodiment of FIG. 5, spindle cap 406 is used to secure indexing plate 500 to an upper end of fluid driven cylinder 404. Similar to the combination of spindle mechanism 400 and spindle plate 220, the combination of spindle mechanism 400 and indexer plate 500 are configured to raise and lower indexing plate 500 as well as rotate indexing plate 500.

After materials are deposited or formed on a surface of a semiconductor substrate in a semiconductor processing tool, it is possible that such deposited or formed materials on the semiconductor substrate surface or materials that have been deposited on components of the tool in the proximity of the semiconductor substrate surfaces will flake off or otherwise be disassociated from the surface upon which they were deposited. When this happens, particles of such flaked off or disassociated materials can find their way to a surface of semiconductor substrates in the tool. For example, the deposited materials may flake off of surfaces that are adjacent to or in close proximity to the semiconductor substrate when the semiconductor substrate is in the processing tool. Examples of surfaces from which the deposited material may flake off of include surfaces of processing chamber components that are used to transfer the semiconductor substrate from one station within the processing tool to another station in the processing tool. For example, such surfaces include the surfaces of a carrier ring used to support the semiconductor substrate during such movement, carrier ring forks or other components, e.g., such as paddles used to lift such carrier rings or the semiconductor substrate, an indexing plate which supports the carrier rings or surfaces of a spindle mechanism upon which the indexing plate is supported and which raises, lowers or rotates the carrier ring forks or indexing plate. It has been observed that vibration induced in such components by the spindle mechanism causes materials deposited on such components to flake off. Embodiments described herein are directed to systems and methods for processing a semiconductor substrate so that the formation of flaked off particles and accumulation of such particles resulting from vibration induced by the spindle mechanism is reduced.

Figure 6:
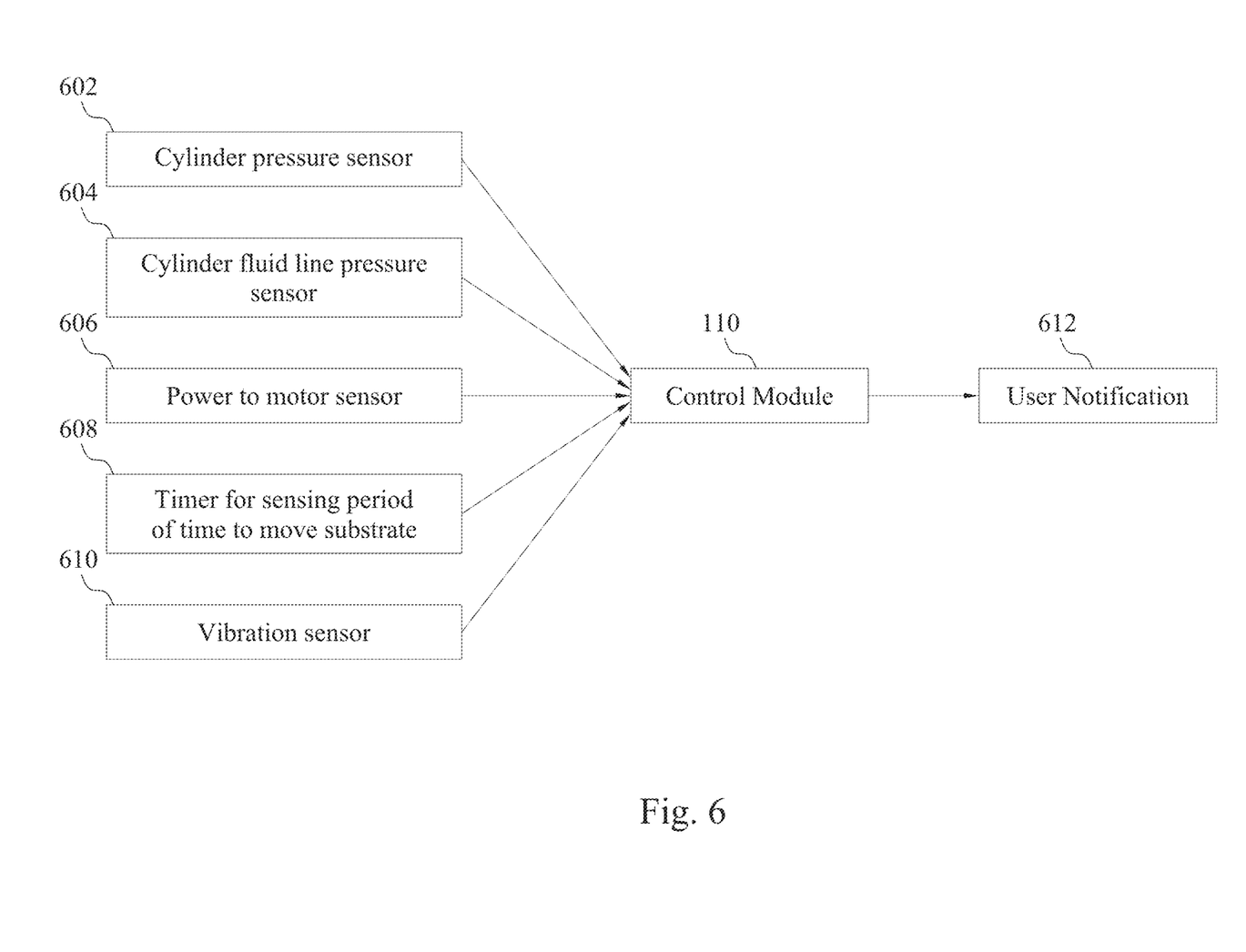
FIG. 6 is a schematic illustration of a control system for use in controlling a process in accordance with embodiments of the present disclosure.

FIG. 6 illustrates a system for reducing particle accumulation on a semiconductor substrate during processing of the semiconductor substrate in a material deposition processing tool. Referring in addition to FIGS. 2-5, the system includes a plurality of processing stations 1-4 in FIGS. 2 and 3 which have been described above and are not described in more detail at this point. The system further includes a spindle mechanism 400 in FIG. 4 that includes a fluid actuated cylinder 404 and an electrically driven motor 402. Spindle mechanism 400, fluid actuated cylinder 404 and an electrically driven motor 402 have been described above and are not described in more detail at this point. The system includes a plurality of carrier rings 200 in FIG. 2 which are each configured to receive a semiconductor substrate. As described above, the carrier rings 200 mechanically cooperate with the spindle mechanism 400 and either a plurality of carrier ring forks 226 or an indexing plate 500 such that the carrier rings 200 and the semiconductor substrate supported on those carrier rings can be raised, lowered and/or rotated from one station to another station. The system of FIG. 6 also includes a plurality of sensors 602, 604, 606, and 610 which detect operation parameters of the spindle mechanism and communicate those spindle operation parameters to the control module 110. Control module 110 processes received spindle operation parameters and outputs a notification to user notification module 612, e.g., a user readable display. In accordance with some embodiments of the present disclosure, the notification to the user is an indication of the need for maintenance of the spindle mechanism to reduce the vibration of the spindle mechanism. In accordance with some embodiments, appropriate maintenance steps are taken based on the results of the monitoring operation parameters of the spindle mechanism.

Cylinder pressure sensor 602 and cylinder fluid line pressure sensor 604 detect the pressure of fluid within cylinder 404 and the pressure of fluid within a line that delivers fluid to cylinder 404, respectively. Cylinder pressure sensor 602 and cylinder fluid line pressure sensor 604 can be any one of a number of analog or digital devices for measuring pressure of gases or liquids within a confined space or conduit and/or the rate of change of such pressure. Examples of suitable devices include those that include a transducer for generating a signal that is a function of the pressure within cylinder 404. In accordance with embodiments of the present disclosure, pressure sensors 602 and 604 detect changes in pressure, especially variations in the rate of change of pressure that are indicative of movement of cylinder 404. For example, in accordance with some embodiments of the present disclosure, when the rate of change of pressure detected by sensors 602 and/or 604 is greater than a threshold level, control module 110 determines that spindle mechanism 400 is not operating smoothly and may generate vibration which will cause unwanted amounts of deposited material to flake off of surfaces of the processing tool. When control module 110 determines that spindle mechanism 400 is not operating smoothly, it issues a notification to user notification module 612. In alternative embodiments where pressure sensors 602 and 604 are not able to determine the rate of change of pressure, control module 110 receives the pressure readings from sensors 602 and/604 and determines the rate of change of the pressure detected by such sensors.

Power to motor sensor 606 detects power provided to an electrically driven motor 402. Power to motor sensor 606 can be any one of a number of analog or digital devices for measuring electric power provided to an electrically driven motor 402. Examples of suitable devices include sensors for detecting current or voltage provided to an electrically driven motor 402. In accordance with embodiments of the present disclosure, power sensor 606 detects changes in power, i.e., current or voltage delivered to an electrically driven motor 402. For example, in accordance with some embodiments of the present disclosure, when the rate of change of power provided to an electrically driven motor 402 is greater than a threshold level, control module 110 determines that spindle mechanism 400 is not operating smoothly and may generate vibration which will cause unwanted amounts of deposited material to flake off of surfaces of the processing tool. When control module 110 determines that spindle mechanism 400 is not operating smoothly, it issues a notification to user notification module 612. In alternative embodiments where power sensors 606 is not able to determine the rate of change of power, control module 110 receives the raw power readings from sensor 606 and determines the rate of change of the power provided to an electrically driven motor 402.

Timer 608 for sensing a period of time to move carrier rings 200 and/or semiconductor substrates 101 includes analog or digital devices capable of measuring a period of time needed to raise the carrier rings 200/semiconductor substrates 101, a period of time needed to lower the carrier rings 200/semiconductor substrates 101 and/or a period of time needed to rotate the carrier rings 200/semiconductor substrates 101 from one station 1-4 to another station 1-4. In accordance with embodiments of the present disclosure, timer 608 detects the length of a period of time need to move carrier rings 200 or semiconductor substrates 101 from one location to another location. For example, in an embodiment, timer 608 detects the length of a period of time needed to raise carrier rings 200 or semiconductor substrates 101 from a lowered position (position where cylinder 404 is retracted) to an elevated position (position where cylinder 404 is extended). In other embodiments, timer 608 detects the length of a period of time needed to rotate the spindle mechanism 400 such that the carrier rings 200 or semiconductor substrates 101 are rotated from one station to another station. For example, in accordance with some embodiments of the present disclosure, when the period of time needed to raise carrier rings 200 or semiconductor substrates 101 from a lowered position (position where cylinder 404 is retracted) to an elevated position (position where cylinder 404 is extended), or vice versa, is greater than a threshold level, control module 110 determines that spindle mechanism 400 is not operating smoothly and may generate vibration which will cause unwanted amounts of deposited material to flake off of surfaces of the processing tool. In other embodiments of the present disclosure, when the period of time needed to rotate the carrier rings 200 or semiconductor substrates 101 from a one station to another station is greater than a threshold level, control module 110 determines that spindle mechanism 400 is not operating smoothly and may generate vibration which will cause unwanted amounts of deposited material to flake off of surfaces of the processing tool. When control module 110 determines that spindle mechanism 400 is not operating smoothly, it issues a notification to user notification module 612. In alternative embodiments where timer 608 is not able to determine a period of time needed to raise carrier rings 200 or semiconductor substrates 101 from a lowered position (position where cylinder 404 is retracted) to an elevated position (position where cylinder 404 is extended) or vice versa, or is unable to determine a period of time to rotate the carrier rings 200 or semiconductor substrates 101 from a one station to another station, but rather is only able to detect when the raising or lowering or rotating begins and ends, control module 110 receives the detected starting and stopping times and determines the length of the period of time between the starting and stopping times.

Sensor 610 for detecting vibration of spindle mechanism 400 includes analog or digital devices capable of measuring acceleration or vibrational changes of the spindle mechanism. Examples of suitable devices for detecting vibration of spindle mechanism 400 include piezoelectric vibration sensors. In accordance with some embodiments of the present disclosure, when the acceleration, vibration, rate of change of acceleration or rate of change of vibration of spindle mechanism 400 is greater than a threshold level, control module 110 determines that spindle mechanism 400 is not operating smoothly and may generate vibration which will cause unwanted amounts of deposited material to flake off of surfaces of the processing tool. When control module 110 determines that spindle mechanism 400 is not operating smoothly, it issues a notification to user notification module 612. In alternative embodiments where sensor 610 is not able to determine the rate of change of acceleration or the rate of change of vibration of spindle mechanism 400, control module 110 receives the raw acceleration or vibration readings from sensor 610 over a period of time and determines the rate of change of the acceleration or vibration of spindle mechanism 400.

In accordance with embodiments of the present disclosure, when control module 110 determines that spindle mechanism 400 is not operating smoothly as described above, methods in accordance with the present disclosure include a step of carrying out one or more maintenance steps on the spindle mechanism. The one or more maintenance steps include one or more steps of lubricating the fluid actuated cylinder, lubricating the electric motor or components of the spindle mechanism connected to the electric motor, adjusting the pressure of the fluid to be delivered to the fluid actuated cylinder and/or replacing seals of the fluid actuated cylinder. Other embodiments in accordance with the present disclosure include maintenance steps other than those described above which when implemented would reduce the vibration of spindle mechanism 400.

In one embodiment, the control module 110 of FIG. 1 includes some of the following example components. For instance, the control module 110 may include a processor, memory and one or more interfaces. The control module 110 is employed to control devices in the system based in part on sensed values. For example only, the control module 110 may control one or more of the sensors 602, 604, 606, and 610 and the user notification module 612. Control module 110 may also control other components of the processing chamber, including pumps, heaters, coolers, power supplies and other devices. The control module 110 may also be employed to control process conditions during precursor delivery and deposition of films. The control module 110 will typically include one or more memory devices and one or more processors. The control module 110 may include any electrical circuitry, features, components, an assembly of electronic components or the like configured to perform the various operations of the data collecting and control features as described herein. For example, the control module 110 may include any processor-based or microprocessor-based system including systems using microcontrollers, reduced instruction set computers (RISC), application specific integrated circuits (ASICs), field-programmable gate arrays (FPGAs), graphical processing units (GPUs), logic circuits, and any other circuit or processor capable of executing the functions described herein. In some embodiments, the control module 110 may be included in or otherwise implemented by processing circuitry such as a microprocessor, microcontroller, integrated circuit, chip, microchip or the like.

The control module 110 executes computer programs including sets of instructions for carrying out the methods described herein. Other computer programs stored on memory devices associated with the control module 110 may be employed in some embodiments.

Typically there will be a user interface associated with the control module 110, e.g., user notification module 612. The user interface may include a display (e.g. a display screen and/or graphical software displays of the apparatus and/or process conditions), and user input devices such as pointing devices, keyboards, touch screens, microphones, etc.

Computer programs for carrying out methods described herein can be written in any conventional computer readable programming language. Compiled object code or script is executed by the processor to perform the tasks identified in the program.

Figure 7:
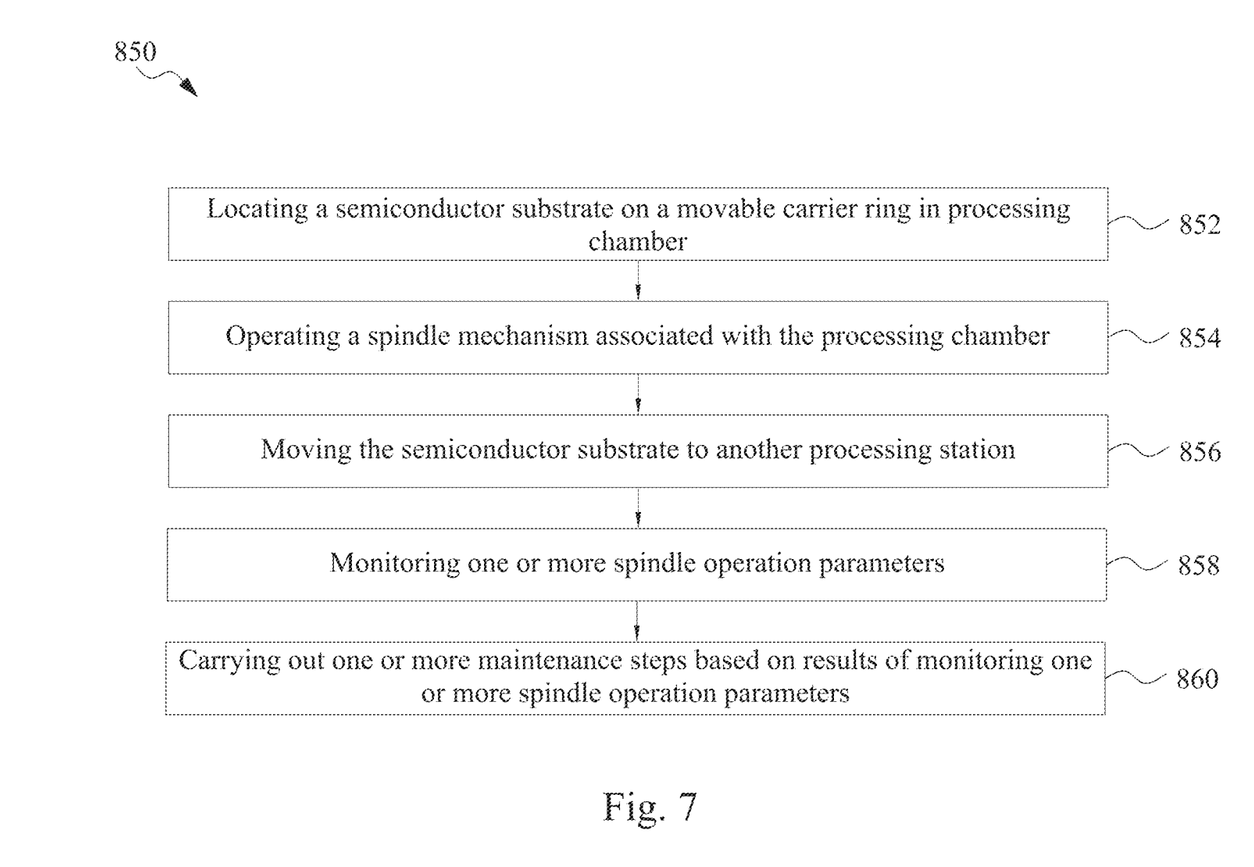
FIG. 7 is a flow chart of a method in accordance with an embodiment of the present disclosure.

Referring to FIG. 7, one embodiment of a method 850 of processing a semiconductor substrate in accordance with the present disclosure includes steps 852, 854, 856, 858 and 860. This method begins at step 852 involving locating a semiconductor substrate on a movable carrier ring in a processing chamber. At step 854, a spindle mechanism associated with the processing chamber is operated. Such operation of the spindle mechanism results in the semiconductor substrate or a carrier ring supporting the semiconductor substrate being moved from one processing station to another processing station at step 856. At step 858, during the movement of the semiconductor substrate, one or more spindle operation parameters are monitored. In accordance with this embodiment, at step 860, one or more maintenance steps are carried out based on results of monitoring the one or more spindle operation parameters.

Figure 8:
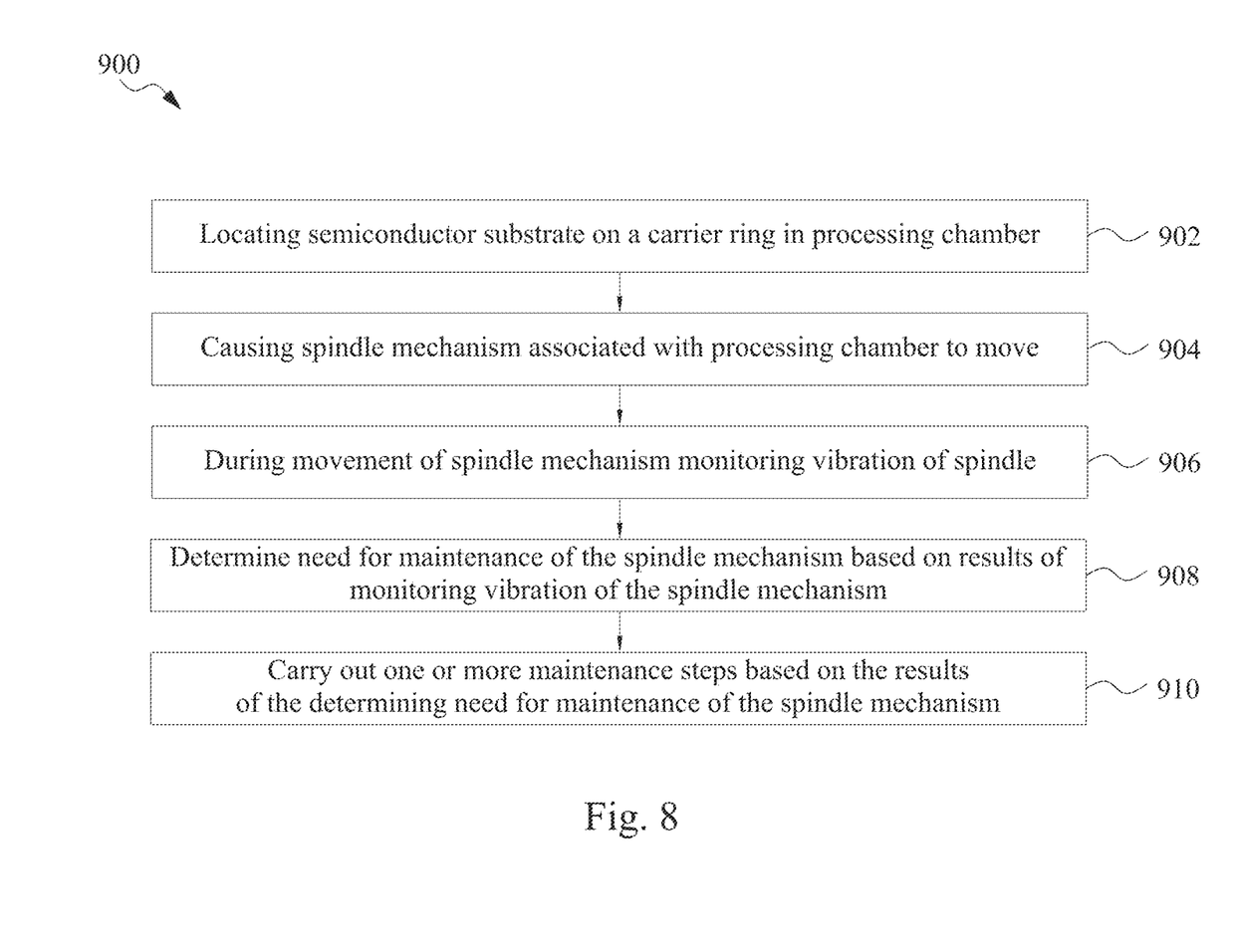
FIG. 8 is a flow chart of a method in accordance with an embodiment of the present disclosure.

FIG. 8 illustrates an embodiment of a method 900 carried out in accordance with the present disclosure. Method 900 includes a step 902 of locating a semiconductor substrate on a carrier ring in a processing chamber. At step 904, a spindle mechanism associated with the processing chamber is cost to move. During movement of the spindle mechanism, vibration of the spindle mechanism is monitored at step 906. At step 908, a determination is made of whether maintenance of the spindle mechanism is needed based on results of monitoring vibration of the spindle mechanism during its movement. At step 910, one or more maintenance steps are carried out based on the results of the determining the need for maintenance.

Figure 9:
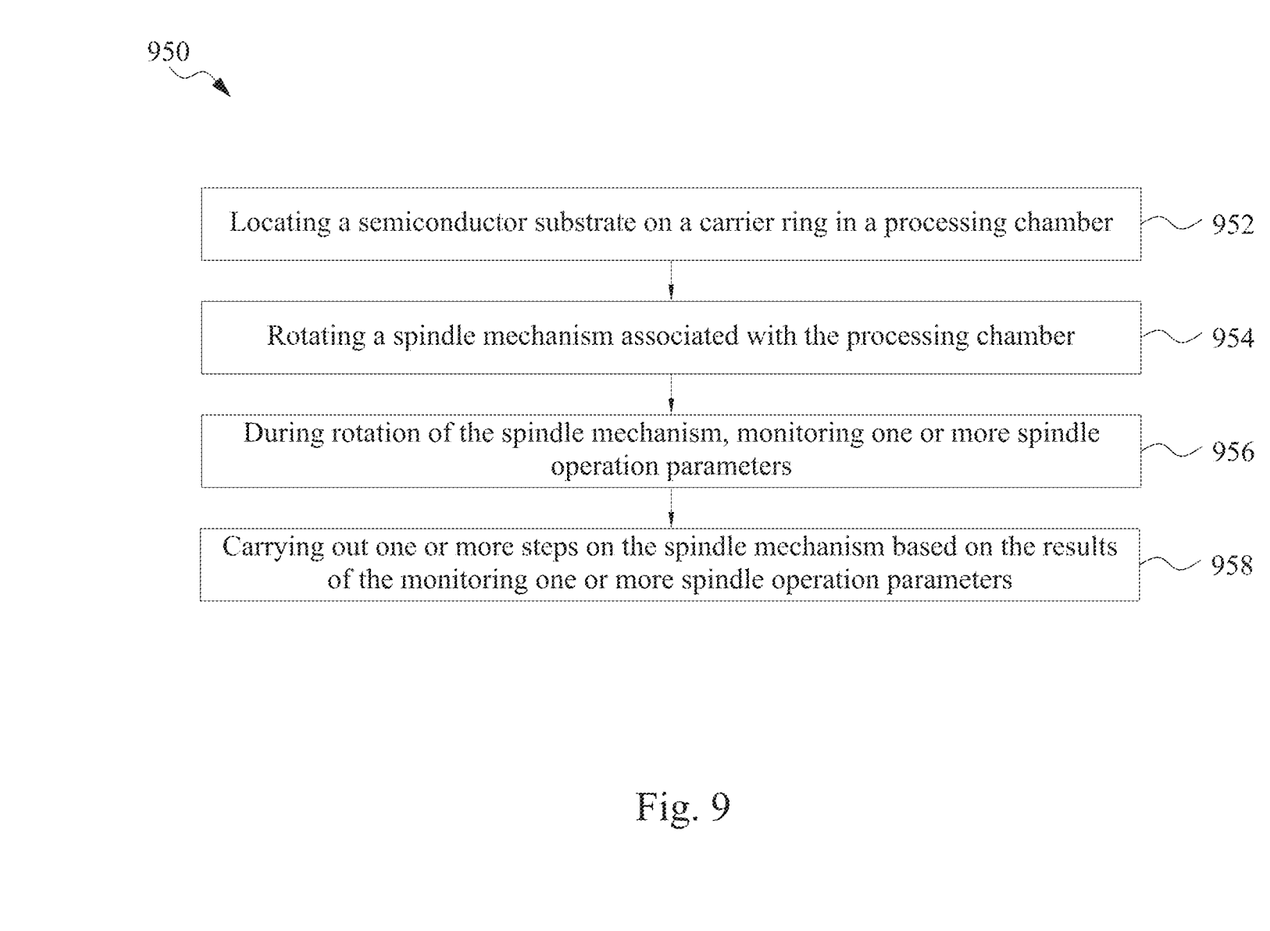
FIG. 9 is a flow chart of a method in accordance with an embodiment of the present disclosure.

FIG. 9 illustrates an embodiment of a method 950 carried out in accordance with the present disclosure. Method 950 includes step 952 of locating a semiconductor substrate on a carrier ring in a processing chamber. Step 954 of method 950 includes rotating a spindle mechanism associated with the processing chamber. At step 956, during rotation of the spindle mechanism, one or more spindle operation parameters is monitored. At step 958, based on the results of monitoring the one or more spindle operation parameters, one or more steps are carried out on the spindle mechanism.

In one embodiment of the present disclosure, a method is provided for processing a semiconductor substrate in a processing chamber. The method includes locating the semiconductor substrate on a movable carrier ring in the processing chamber. The processing chamber may include multiple movable carrier rings. A spindle mechanism associated with the processing chamber is operated and causes the semiconductor substrate to be moved from one processing station to another processing station within the processing chamber. In one embodiment, the spindle mechanism includes a fluid actuated cylinder and an electric driven motor. During the movement of the semiconductor substrate, one or more spindle operation parameters are monitored. These operation parameters include monitoring pressure of fluid to be delivered to the fluid actuated cylinder, pressure of fluid within the fluid actuated cylinder, electric current received by the electric driven motor, period of time for the semiconductor substrate to be raised, lowered or raised and lowered, and vibration of the spindle. This method includes carrying out one or more maintenance steps based on the results of the monitoring the one or more specific spindle operation parameters. The maintenance steps include lubricating the fluid actuated cylinder, lubricating the electric motor or components of the spindle mechanism connected to the electric motor, adjusting the pressure of the fluid to be delivered to the fluid actuated cylinder and replacing seals of the fluid actuated cylinder.

In another embodiment of the present disclosure, a method of processing a semiconductor substrate includes locating the semiconductor substrate on a carrier ring in a processing chamber. This method involves causing a spindle mechanism associated with the processing chamber to move causing the semiconductor substrate to be moved. The spindle mechanism includes a fluid activated cylinder and an electric driven motor. During movement of the spindle mechanism, vibration of the spindle mechanism is monitored. The need for maintenance of the spindle mechanism is determined based on results of the monitoring vibration of the spindle mechanism. Once the need for maintenance is determined, maintenance of the spindle mechanism is carried out.

In another embodiment of the present disclosure, a system for reducing particle accumulation on a semiconductor substrate during processing of the semiconductor substrate in a material deposition tool is provided. The system includes a plurality of processing stations and a spindle mechanism including a fluid actuated cylinder and a motor. The system further includes a plurality of carrier rings with each carrier ring configured to receive a semiconductor device. The carrier rings mechanically cooperate with the spindle mechanism to raise or lower the carrier rings at a station of the plurality of stations or to rotate the carrier rings from one station of the plurality of stations to another station of the plurality of stations. The system further includes one or more of a sensor to detect pressure of fluid to be delivered to the fluid actuated cylinder, a sensor to detect pressure of fluid within the fluid actuated cylinder, a sensor to detect electric current received by the electric driven motor, a sensor to detect a period of time needed to raise, lower, or raise and lower one of the plurality of carrier rings and a sensor to detect vibration of the spindle mechanism.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A method of processing a semiconductor substrate, the method comprising:
   locating the semiconductor substrate on a movable carrier ring in a processing chamber;
   operating a spindle mechanism associated with the processing chamber, operation of the spindle mechanism causing the semiconductor substrate to be moved from one processing station to another processing station, the spindle mechanism including a fluid actuated cylinder and an electric driven motor;

monitoring one or more spindle operation parameters selected from:

pressure of fluid to be delivered to the fluid actuated cylinder, pressure of fluid within the fluid actuated cylinder, electric current received by the electric driven motor, period of time for the semiconductor substrate to be raised, lowered or raised and lowered, and vibration of the spindle mechanism; and carrying out one or more maintenance steps based on the results of the monitoring one or more spindle operation parameters, the one or more maintenance steps being one or more of:

lubricating the fluid actuated cylinder, lubricating the electric driven motor or components of the spindle mechanism connected to the electric driven motor, adjusting the pressure of the fluid to be delivered to the fluid actuated cylinder, and replacing seals of the fluid actuated cylinder.

2. The method of claim 1, wherein the locating the semiconductor substrate on a carrier ring in a processing chamber includes locating the semiconductor substrate on a carrier ring in a chemical vapor deposition chamber.

3. The method of claim 1, wherein the locating the semiconductor substrate on a carrier ring in a processing chamber includes locating a semiconductor substrate on each of four carrier rings.

4. The method of claim 1, further comprising raising or lowering an indexer plate by extending or retracting the fluid actuated cylinder.

5. The method of claim 4, further comprising during the extending or retracting the fluid actuated cylinder, monitoring the one or more spindle operation parameters.

6. The method of claim 1, further comprising determining a need for maintenance of the spindle mechanism based on results of monitoring the one or more spindle operation parameters.

7. The method of claim 1, wherein the operating the spindle mechanism includes raising or lowering a carrier ring fork by extending or retracting the fluid actuated cylinder.

8. A method of processing a semiconductor substrate, the method comprising:

locating the semiconductor substrate on a carrier ring in a processing chamber;

causing a spindle mechanism associated with the processing chamber to move, the spindle mechanism including a fluid actuated cylinder and an electric driven motor, movement of the spindle mechanism causing the semiconductor substrate to be moved;

during the movement of the spindle mechanism, monitoring vibration of the spindle mechanism;

determining a need for maintenance of the spindle mechanism based on results of the monitoring vibration of the spindle mechanism; and carrying out one or more maintenance steps based on the results of the monitoring vibration of the spindle mechanism.

9. The method of claim 8, wherein the monitoring vibration of the spindle mechanism further comprises:

monitoring one or more spindle operation parameters selected from:

pressure of fluid to be delivered to the fluid actuated cylinder, pressure of fluid within the fluid actuated cylinder, electric current received by the electric driven motor, and period of time for the carrier ring to be raised, lowered or raised and lowered.

10. The method of claim 9, wherein the one or more maintenance steps are one or more of:

lubricating the fluid actuated cylinder, lubricating the electric driven motor or components of the spindle mechanism connected to the electric driven motor, adjusting the pressure of the fluid to be delivered to the fluid actuated cylinder, and replacing seals of the fluid actuated cylinder.

11. The method of claim 8, wherein causing the spindle mechanism to move further includes raising or lowering the spindle mechanism.

12. The method of claim 11, wherein raising or lowering the spindle mechanism includes extending or retracting the fluid actuated cylinder.

13. The method of claim 8, wherein causing the spindle mechanism to move further includes rotating the spindle mechanism.

14. The method of claim 11, wherein the raising or lowering the spindle mechanism causes one or more carrier ring forks associated with the spindle mechanism to be raised or lowered.

15. The method of claim 8, wherein the locating the semiconductor substrate on a carrier ring in a processing chamber includes locating a semiconductor substrate on each of four carrier rings of an indexer plate.

16. The method of claim 8, wherein the processing chamber is an atomic layer deposition chamber, a plasma enhanced chemical vapor deposition chamber or a chemical vapor deposition chamber.

17. A system for reducing particle accumulation on a semiconductor substrate during processing of the semiconductor substrate in a material deposition processing tool, the system comprising:

a plurality of processing stations;

a spindle mechanism including a fluid actuated cylinder and an electric driven motor;

a plurality of carrier rings, each carrier ring configured to receive a semiconductor substrate, the carrier rings mechanically cooperating with the spindle mechanism to raise or lower the carrier rings at a station of the plurality of stations or to rotate the carrier rings from one station of the plurality of stations to another station of the plurality of stations; and one or more sensor selected from:

a sensor to detect pressure of fluid to be delivered to the fluid actuated cylinder, a sensor to detect pressure of fluid within the fluid actuated cylinder, a sensor to detect electric current received by the electric driven motor, a sensor to detect a period of time needed to raise, lower or raise and lower one of the plurality of carrier rings, and a sensor to detect vibration of the spindle mechanism.

18. The system of claim 17, wherein the plurality of processing stations are a plurality of chemical vapor deposition processing stations.

19. The system of claim 17, further comprising a plurality of carrier ring forks mechanically coupled to the spindle mechanism.

20. The system of claim 17, further comprising an indexing plate mechanically coupled to the spindle mechanism.

* * * * *